(12) United States Patent
Liaw

(10) Patent No.: US 8,779,528 B2
(45) Date of Patent: Jul. 15, 2014

(54) SRAM CELL COMPRISING FINFETS

(71) Applicant: Taiwan Semiconductor Manfacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 3 days.

(21) Appl. No.: 13/691,187

(22) Filed: Nov. 30, 2012

(65) Prior Publication Data

US 2014/0151811 A1 Jun. 5, 2014

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .................... 257/393; 257/903; 257/E27.098

(58) Field of Classification Search
USPC ................. 257/202, 204, 206, 368, 393, 903, 257/E27.098
See application file for complete search history.

(56) References Cited

U.S. PATENT DOCUMENTS

| 4,623,989 | A | 11/1986 | Blake |
|---|---|---|---|
| 6,522,562 | B2 | 2/2003 | Foss |
| 7,250,657 | B2 * | 7/2007 | Liaw .................. 257/350 |
| 7,674,703 | B1 | 3/2010 | Schiwon et al. |
| 8,315,084 | B2 | 11/2012 | Liaw et al. |
| 2004/0170926 | A1 | 9/2004 | Chandhok |
| 2006/0215441 | A1 | 9/2006 | Matsushige et al. |
| 2007/0235765 | A1 | 10/2007 | Liaw |
| 2008/0239859 | A1 | 10/2008 | Georgakos et al. |
| 2008/0299780 | A1 | 12/2008 | Elliott et al. |
| 2009/0014798 | A1 | 1/2009 | Zhu et al. |
| 2011/0133285 | A1 | 6/2011 | Liaw |
| 2012/0230088 | A1 | 9/2012 | Houston |
| 2012/0299106 | A1 | 11/2012 | Mann |

FOREIGN PATENT DOCUMENTS

| KR | 1020080089190 | 10/2008 |
|---|---|---|
| KR | 1020110065355 | 6/2011 |

OTHER PUBLICATIONS

Choi, Munkang et al., "14 nm FinFET Stress Engineering with Epitaxial SiGe Source/Drain," International Silicon-Germanium Technology and Device Meeting (ISTDM), Jun. 4-6, 2012, 2 pages.

* cited by examiner

*Primary Examiner* — Hoai V Pham
(74) *Attorney, Agent, or Firm* — Slater and Matsil, L.L.P.

(57) ABSTRACT

A Static Random Access Memory (SRAM) cell includes a first pull-up Fin Field-Effect Transistor (FinFET) and a second pull-up FinFET, and a first pull-down FinFET and a second pull-down FinFET forming cross-latched inverters with the first pull-up FinFET and the second pull-up FinFET. A first pass-gate FinFET is connected to drains of the first pull-up FinFET and the first pull-down FinFET. A second pass-gate FinFET is connected to drains of the second pull-up FinFET and the second pull-down FinFET, wherein the first and the second pass-gate FinFETs are p-type FinFETs. A p-well region is in a center region of the SRAM cell and underlying the first and the second pull-down FinFETs. A first and a second n-well region are on opposite sides of the p-well region.

20 Claims, 10 Drawing Sheets

SRAM CELL COMPRISING FINFETS

CROSS-REFERENCE TO RELATED APPLICATION

This application relates the following commonly-assigned U.S. patent application Ser. No. 13/691,373, filed Nov. 30, 2012, and entitled "SRAM Cell Comprising FinFETs;", which application is hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements.

Figure 1:
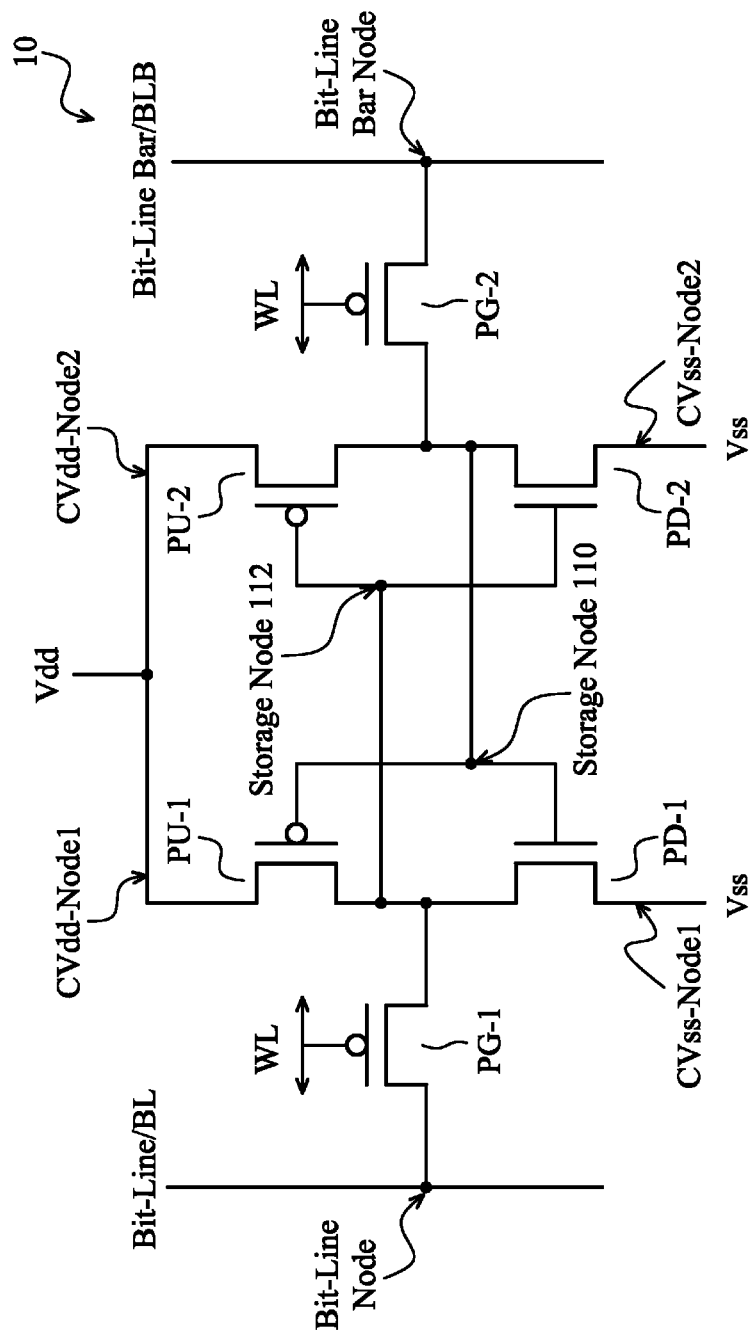
FIGS. 1 and 2 are circuit diagrams of a Static Random Access Memory (SRAM) cell in accordance with exemplary embodiments.

FIG. 1 illustrates a circuit diagram of SRAM cell 10 in accordance with some embodiments. SRAM cell 10 includes pass-gate transistors PG-1 and PG-2, pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. Pass-gate transistors PG-1 and PG-2 are P-type transistors in accordance with some embodiments. The gates of pass-gate transistors PG-1 and PG-2 are connected to, and controlled by, word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in storage node 110 and storage node 112. The stored bit can be written into, or read from, SRAM cell 10 through Bit-line line (BL) and Bit-Line Bar (BLB), wherein BL and BLB may carry complementary bit-line signals. SRAM cell 10 is powered through a positive power supply node Vdd that has a positive power supply voltage (also denoted as Vdd). SRAM cell 10 is also connected to power supply voltage Vss, which may be an electrical ground.

The sources of pull-up transistors PU-1 and PU-2 are connected to CVdd-node1 and CVdd-node2, respectively, which are further connected to power supply voltage Vdd. Power supply voltage Vdd may be carried by metal line CVdd. The sources of pull-down transistors PD-1 and PD-2 are connected to CVss-node1 and CVss-node2, respectively, which are further connected to power supply voltage Vss. Voltage Vss may be carried by metal line. The gates of transistors PU-1 and PD-1 are connected to the drains of transistors PU-2 and PD-2, which connection node is storage node 110. The gates of transistors PU-2 and PD-2 are connected to the drains of transistors PU-1 and PD-1, which connection node is storage node 112. A source/drain region of pass-gate transistor PG-1 is connected to Bit-line BL at a Bit-line node. A source/drain region of pass-gate transistor PG-2 is connected to Bit-line bar BLB at a Bit-line bar node.

Figure 2:
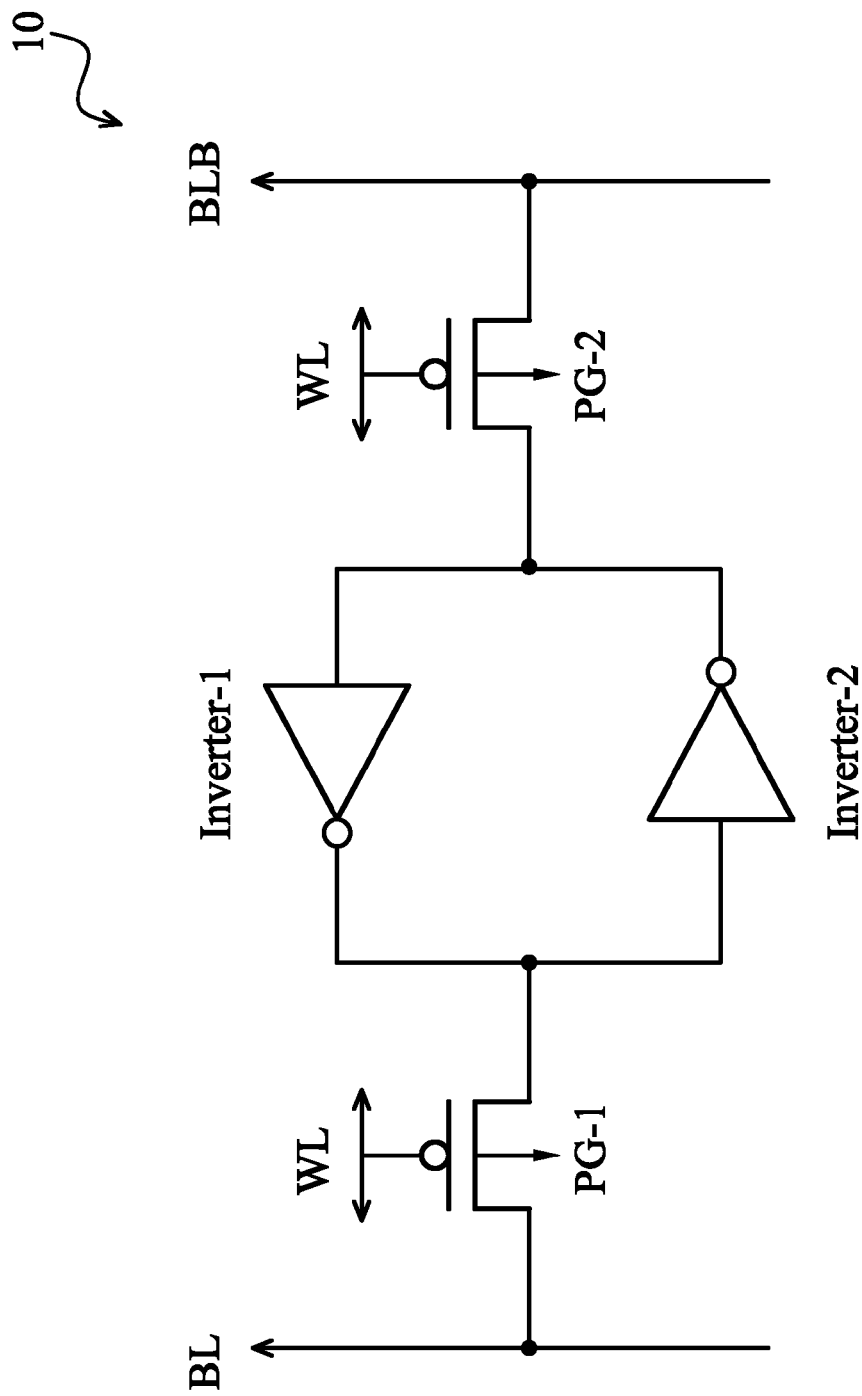

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
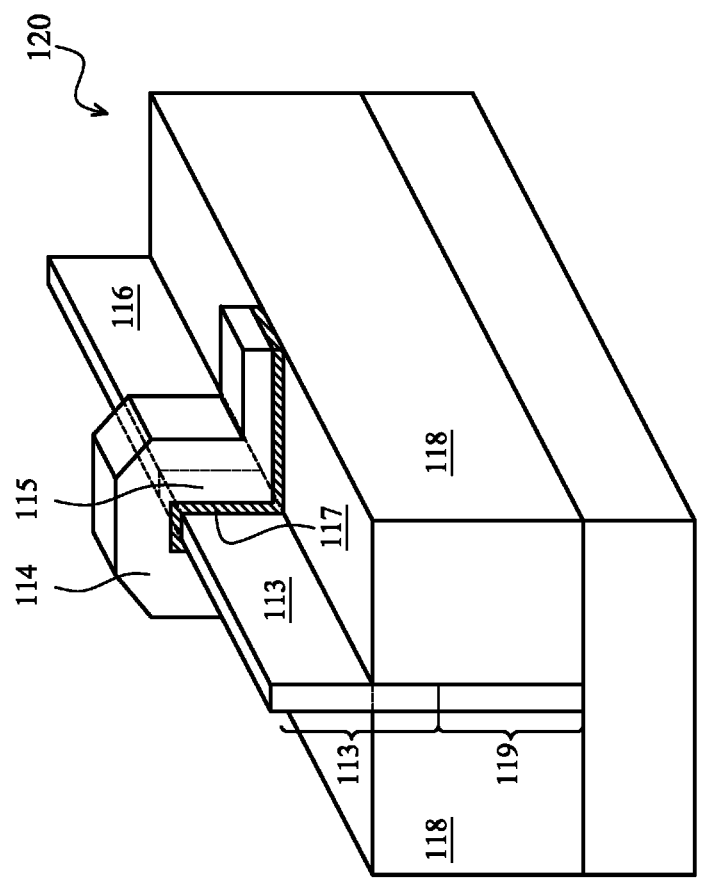
FIG. 3 is a perspective view of a Fin Field-Effect Transistor (FinFET)

FIG. 3 illustrates a perspective view of FinFET transistor 120, which may be any of the FinFETs in SRAM cell 10, including PG-1, PU-1, PD-1, PG-2, PU-2, and PD-2. FinFET 120 includes gate dielectric 117, gate electrode 114, and a semiconductor fin, which includes center fin portion 115, drain region 113, and source region 116. Insulation regions 118 are formed on opposite sides of semiconductor strip 119, over which fin portion 115 is located. Fin portion 115 may be aligned to, and may comprise a same material as, semiconductor strip 119 in some exemplary embodiments. Fin portion 115, drain region 113, and source region 116 in combination represents semiconductor fins 14, 20, 34, and/or 40 (for example, FIGS. 5 through 8) throughout the layouts of the present disclosure. Isolation regions 118 may be Shallow Trench Isolation (STI) regions, although field oxide regions may be used. Gate dielectric 117 and gate electrode 114 comprise portions on the sidewalls and a top surface of fin portion 115. Accordingly, the channel between drain region 113 and source region 116 includes sidewall portions and the top surface portion of semiconductor fin 115.

In some embodiments, drain region 113 and source regions 116 of p-type FinFETs PG-1, PG-2, PU-1, and PU-2 are formed by implanting end portions of the semiconductor fin with a p-type impurity such as boron, indium, or the like. In alternative embodiments, drain region 113 and source regions 116 are formed by etching end portions of original fin (such as fins 14 and 34 in FIGS. 5 through 8) to form recesses, and growing epitaxy regions in the recesses. The epitaxy regions may include Si, SiGe, SiGe C, Ge, or combinations thereof. Accordingly, in FIG. 3, drain region 113 and source regions 116 may comprise silicon germanium in some exemplary embodiments, while the underlying semiconductor strip may be silicon strips. P-type impurities may be in-situ doped in the source and drain regions during the epitaxy. By forming the epitaxy regions, the drive currents Ion of pass-gate FinFETs PU-1 and PU-2 may be stronger than the drive currents Ion of pull-down transistor PD-1 and PD-2 by at least 5% or greater.

Figure 4:
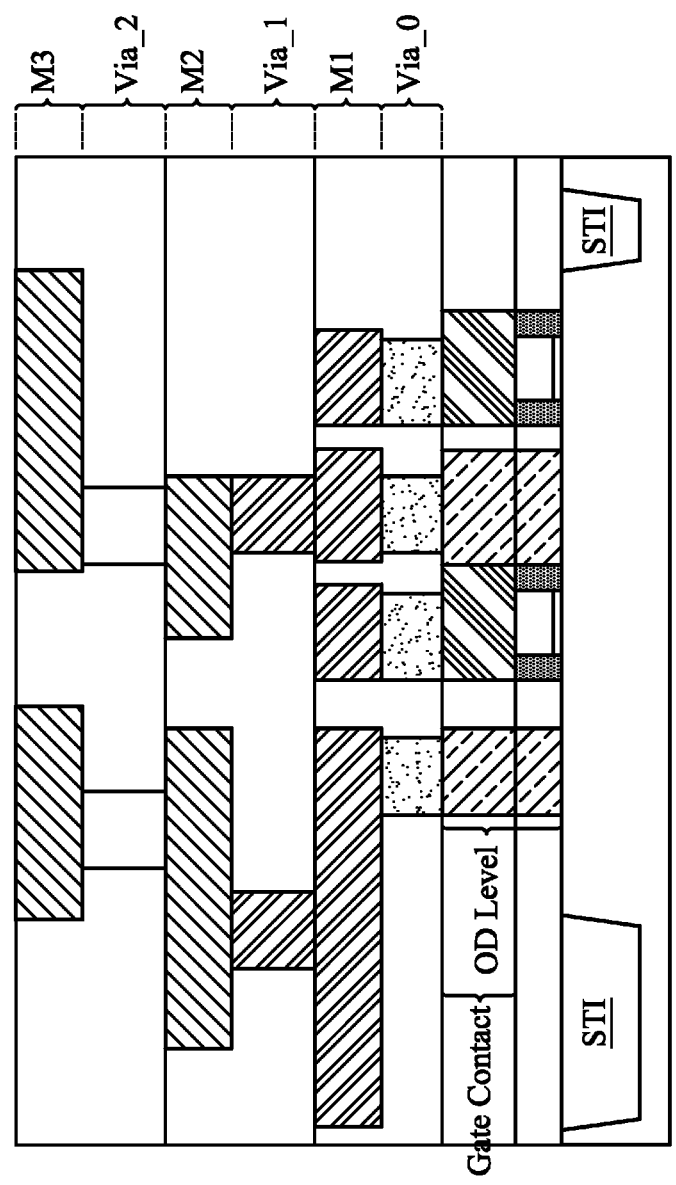
FIG. 4 illustrates a schematic cross-sectional view illustrating layers of an SRAM cell.

FIG. 4 illustrates a schematic cross-sectional view of SRAM cell 10, which layers are formed on a semiconductor chip or wafer. It is noted that FIG. 4 is schematically illustrated to show various levels of interconnect structure and transistors, and may not reflect the actual cross-sectional view of SRAM cell 10. The interconnect structure includes gate contact level, an OD (wherein the term "OD" represents "active region") level, via levels Via_0, Via_1, and Via_2, and metal layers M1, M2, and M3. Each of the levels and layers includes one or more dielectric layers and the conductive features formed therein. The conductive features that are at the same level may have top surfaces substantially level to each other, bottom surfaces substantially level to each other, and may be formed simultaneously. The features in the gate contact level connects gate electrodes of transistors (such as the illustrated exemplary transistors PU-1 and PU-2) to an overlying level such as the Via_0 level. The features in the OD level connects source and drain regions of transistors, pickup regions of well regions, and the like to an overlying level such as the Via_0 level.

Figure 5:
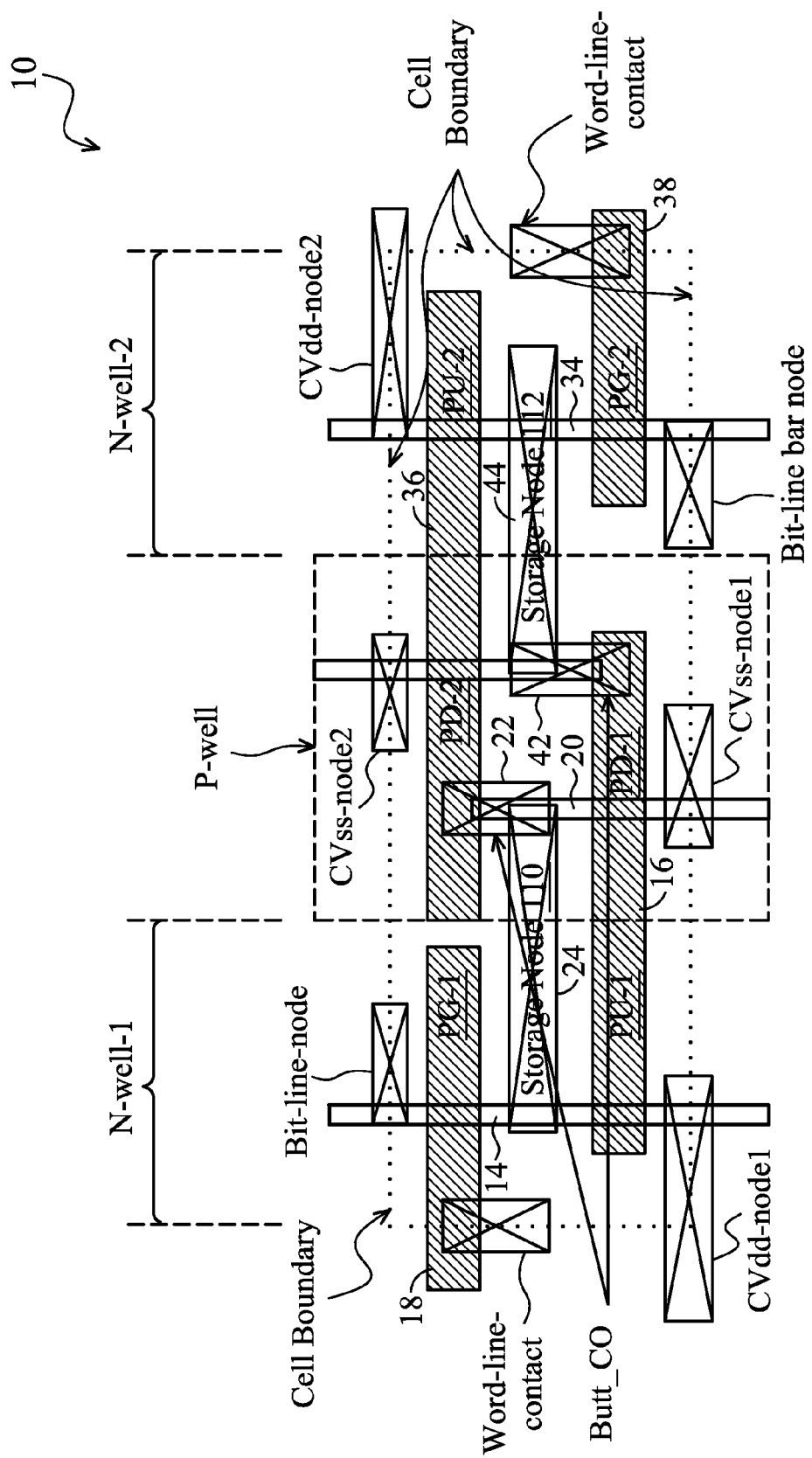
FIGS. 5-8 are layouts of some exemplary SRAM cells in accordance with various embodiments.

FIG. 5 illustrates a layout of SRAM cell 10 in accordance with exemplary embodiments. The outer boundaries of SRAM cell 10 are illustrated using dashed lines, which form a rectangle. Nodes CVdd-node1, CVdd-node2, CVss-node1, CVss-node2, bit-line-node, and bit-line bar node, which are shown in FIG. 1, are also illustrated in FIG. 5. Also, some other nodes such as Word-line contacts are also illustrated in FIG. 5. Gate electrode 16 forms pull-up transistor PU-1 with the underlying semiconductor fin 14. Gate electrode 16 further forms pull-down transistor PD-1 with the underlying semiconductor fin 20. Gate electrode 18 forms pass-gate transistor PG-1 with the underlying semiconductor fin 14, which is the same fin that also forms pull-up transistor PU-1. Gate electrode 36 forms pull-up transistor PU-2 with the underlying semiconductor fin 34. Gate electrode 36 further forms pull-down transistor PD-2 with the underlying semiconductor fin 40. Gate electrode 38 forms pass-gate transistor PG-2 with the underlying semiconductor fin 34, which is the same fin that also form pull-up transistor PU-2.

SRAM cell 10 includes a P-well region and two N-well regions N-well-1 and N-well-2 on opposite sides of the P-well region. A first butted contact plug Butt-CO is used to electrically connect gate electrode 36 of transistors PU-2 and PD-2 to the drain region of transistor PD-1, and a second butted contact plug Butt-CO is used to electrically connect gate electrode 16 of transistors PU-1 and PD-1 to the drain region of transistor PD-2. Butted contacts Butt-CO are formed in the contact level and the OD level in FIG. 4. Long contact 24 is used to connect fin 14 (the drain region of FinFET PU-1) to fin 20 and the first butted contact Butt-CO, wherein long contact 24 and the first butted contact Butt-CO form storage node 110 (also refer to FIG. 1). Long contact 24 has a longitudinal direction perpendicular to the longitudinal directions of fins 14, 20, 34, and 40. Long contact 44 is used to connect fin 34 (the drain region of FinFET PU-2) to fin 40 and the second butted contact Butt-CO, wherein long contact 44 and the second butted contact Butt-CO form storage node 112 (also refer to FIG. 1). Long contact 44 has a longitudinal direction parallel to the longitudinal direction of long contact 24.

Figure 6:
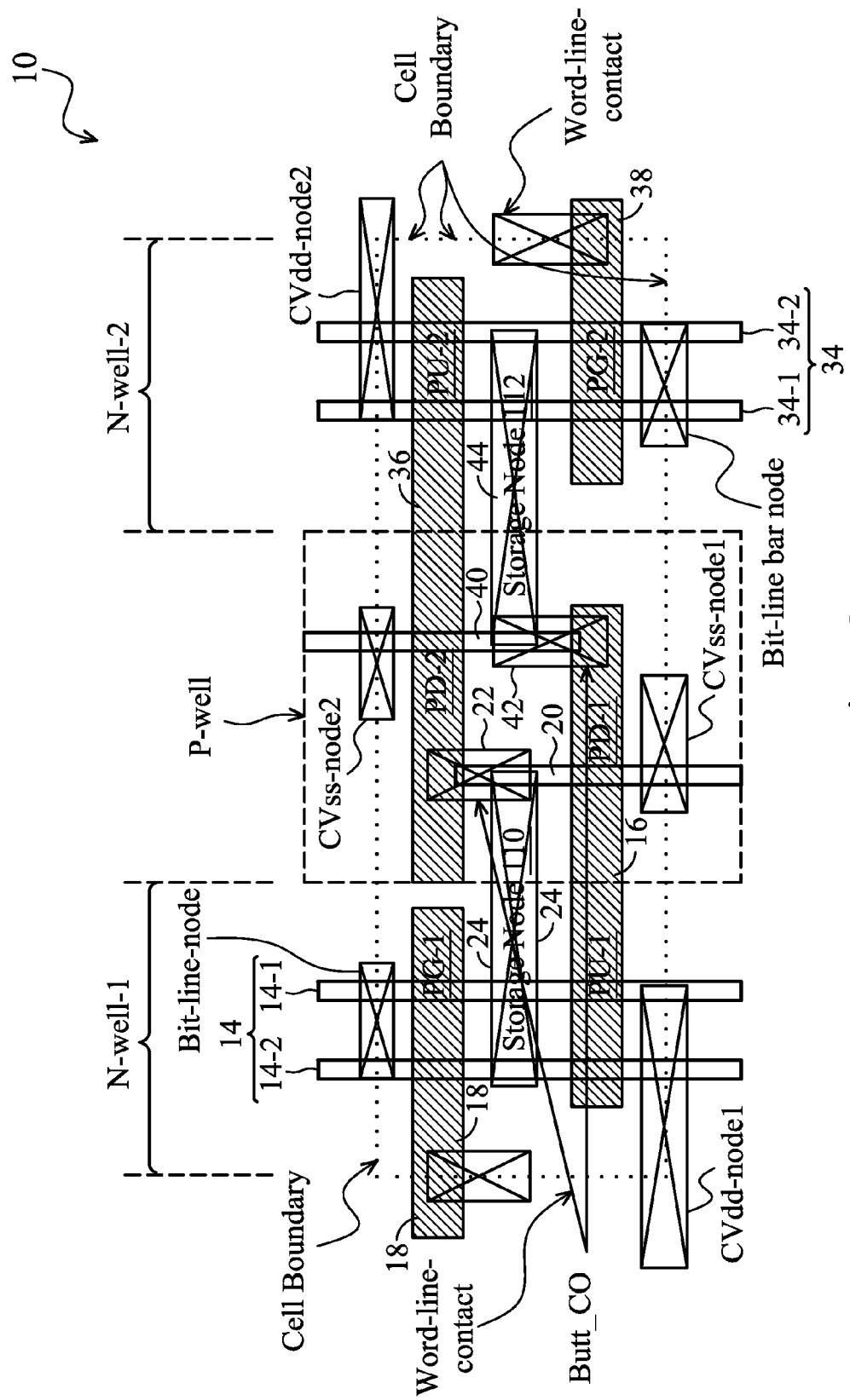
Figure 7:
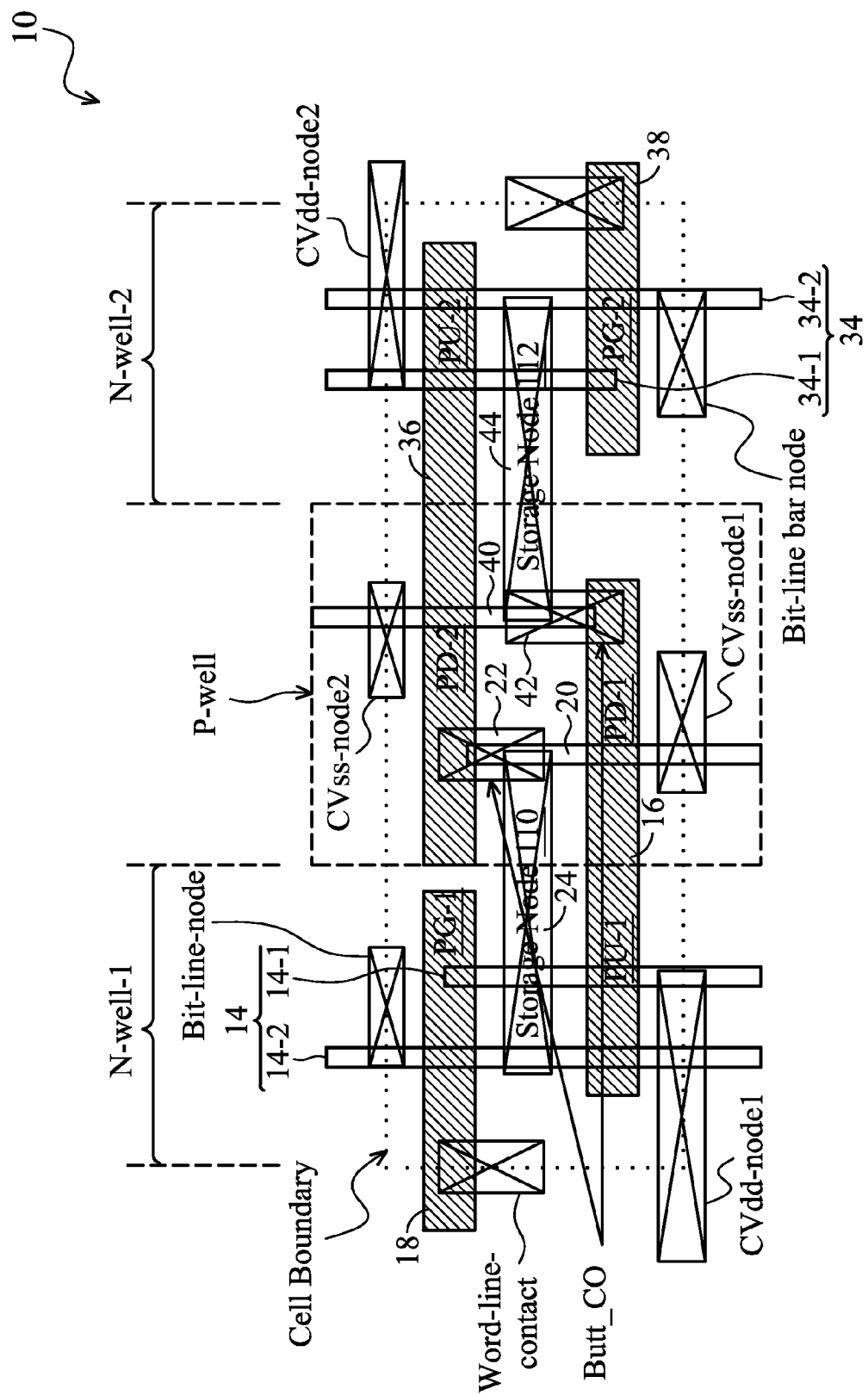
Figure 8:
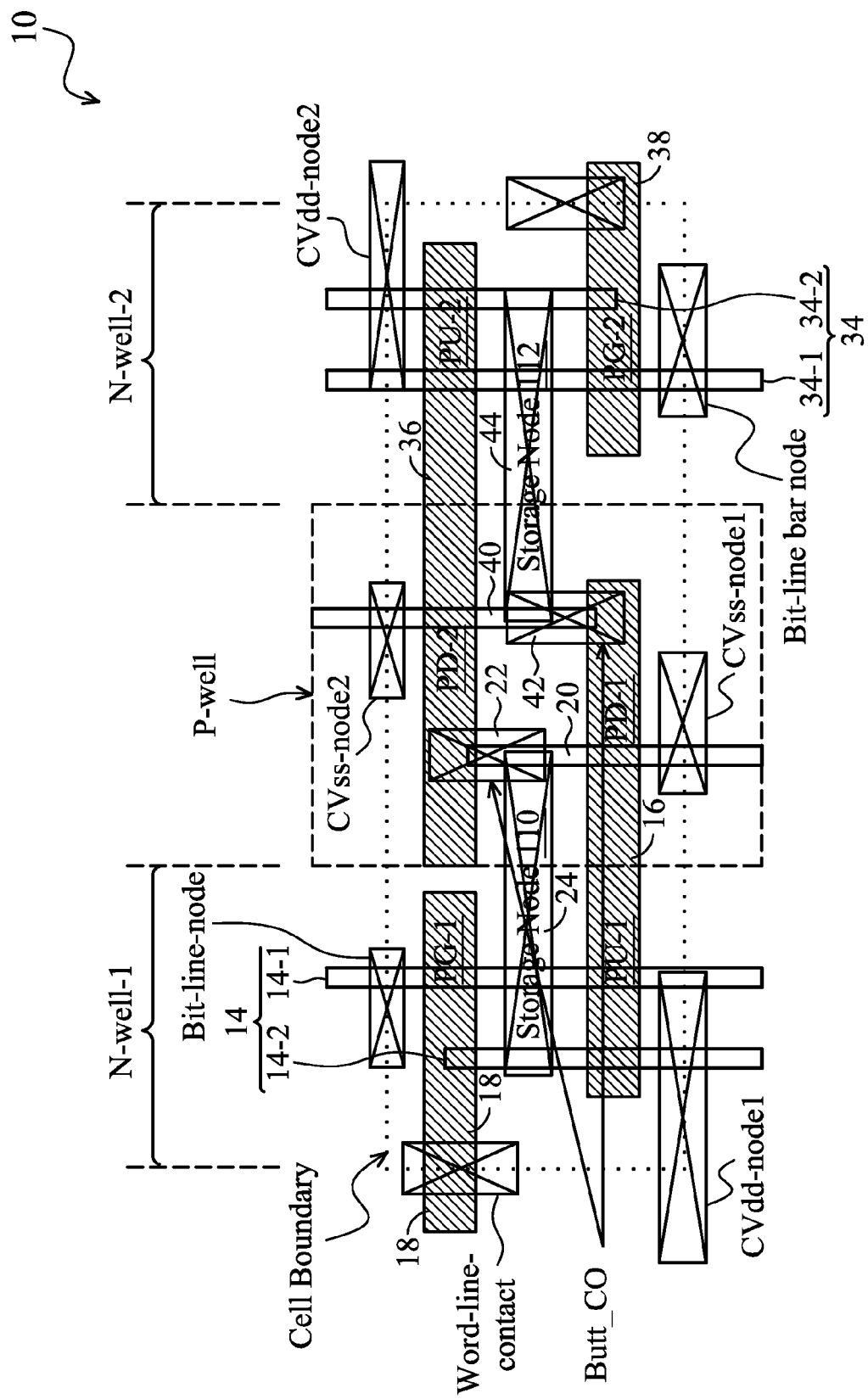

FIGS. 6 through 8 illustrate the layouts of SRAM cell 10 in accordance with alternative embodiments. Unless specified otherwise, the components in subsequently discussed embodiments are essentially the same as the like components, which are denoted by like reference numerals in the embodiments shown in FIGS. 1 through 5. The details regarding the components shown in the subsequently discussed embodiments may thus be found in the discussion of the embodiment shown in FIGS. 1 through 5.

FIG. 6 illustrates SRAM cell 10, which is similar to the embodiments in FIG. 5, except that each of p-type FinFETs PG-1, PU-1, PG-2, and PU-2 may be a multi-fin FinFET comprising a plurality of (such as two, three, four, or more) semiconductor fins. Pull-down FinFETs PD-1 and PD-2 may be single-fin FinFETs, with each including a single semiconductor fin (20 or 40), although they can also be multi-fin FinFETs. For example, as shown in FIG. 6, each of p-type FinFETs PG-1 and PU-1 comprises two fins 14, which are denoted as 14-1 and 14-2, and each of p-type FinFETs PG-2 and PU-2 comprises two fins 34, which are denoted as 34-1 and 34-2. By adding more fins, the currents Ion of p-type FinFETs PG-1, PU-1, PG-2, and PU-2 are improved, and hence the speed of SRAM cell 10 is improved. Again, FIG. 6 includes SRAM cell 10 that includes a P-well region formed between two N-well regions N-well-1 and N-well-2.

FIG. 7 illustrates SRAM cell 10, wherein each of pull-up FinFETs PU-1 and PU-2 includes two fins 14-1 and 14-2. Pass-gate FinFETs PG-1 and PG-2, however, are single-fin FinFETs. Pull-down FinFETs PD-1 and PD-2 may be single-fin FinFETs, although they can also be multi-fin FinFETs.

FIG. 8 illustrates an embodiment similar to the embodiment in FIG. 7, except that in FIG. 7, fin 34-1, which is closer to the P-well region, does not extend underlying gate electrode 38, and fin 34-2, which is closer to the P-well, extends underlying gate electrode 38. In FIG. 8, however, fin 34-1 extends underlying gate electrode 38, and fin 34-2 does not extend underlying gate electrode 38. Similarly, fins 14-1 and 14-2 in FIGS. 7 and 8 have similar arrangement as fins 34-1 and 34-2, respectively.

Figure 9:
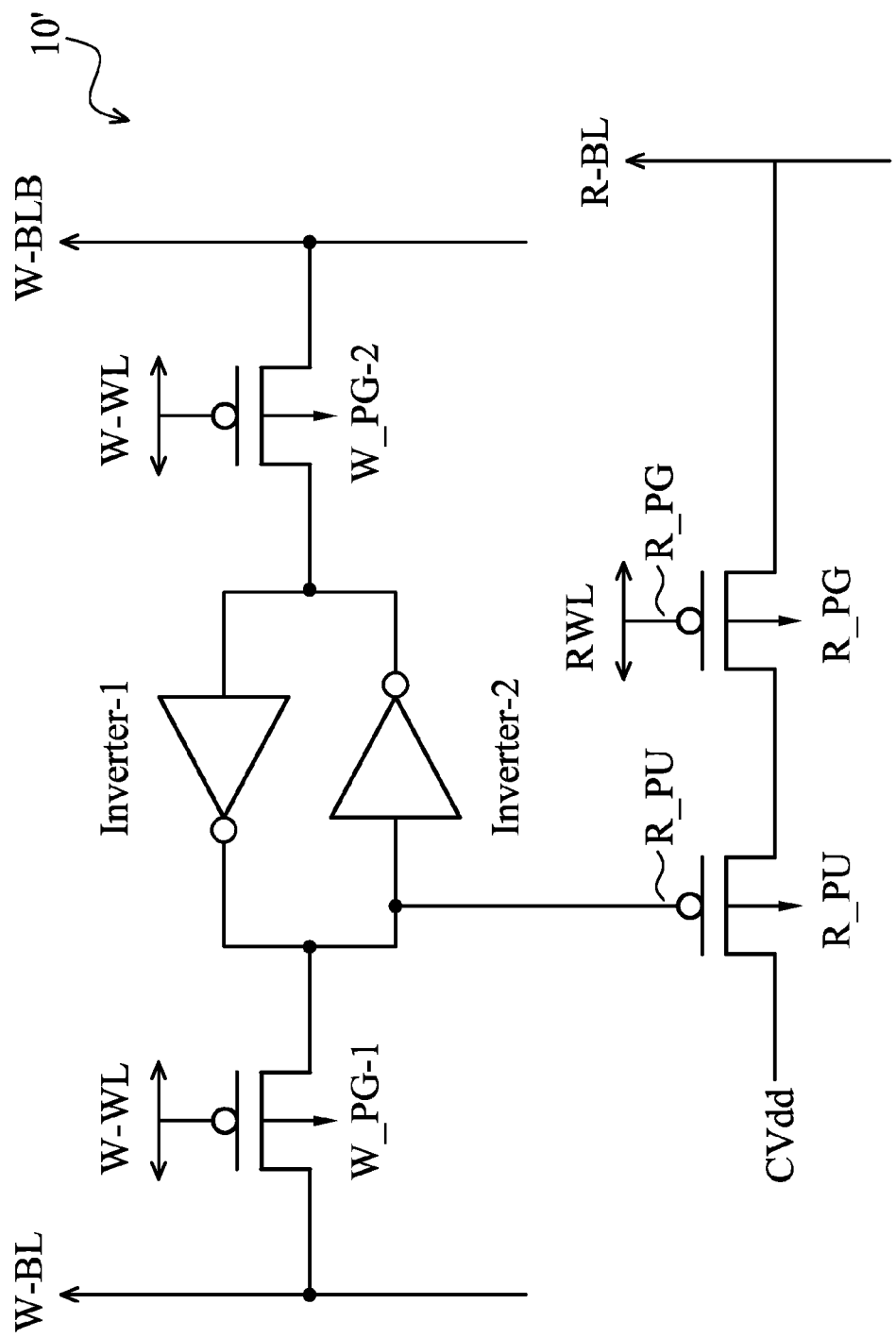
FIG. 9 is a circuit diagram of a two-port SRAM cell in accordance with exemplary embodiments.

FIG. 9 illustrates a circuit diagram of a two-port SRAM cell 10', which includes a write port and a read port. The write port includes inverters Inverter-1 and Inverter-2, which are essentially the same as the inverters Inverter-1 and Inverter-2 in FIG. 2, wherein inverter Inverter-1 includes FinFETs PU-1 and PD-1 in FIG. 1, and inverter Inverter-2 includes FinFETs PU-2 and PD-2 in FIG. 1. The write port further includes p-type pass-gate FinFETs W_PG-1 and W_PG-2, wherein the gates of FinFETs W_PG-1 and W_PG-2 are coupled to write word-line W-WL. The writing of SRAM cell 10' is through complementary write bit-lines W-BL and W-BLB. The read port includes inverters Inverter-1 and Inverter-2, pull-up transistor R_PU, and pass-gate transistor R_PG. Transistors R_PU and R_PG are p-type transistors, and may be FinFETs, which have the structure similar to what is shown in FIG. 3. The data read from SRAM cell is sent to read bit-line R-BL. Transistors R_PU is further coupled to positive power supply CVdd and either one of the inputs of inverters Inverter-1 and Inverter-2. Transistors R_PU and R_PG are cascaded. The gate of transistor R-PG may be coupled to read word-line WL.

Figure 10:
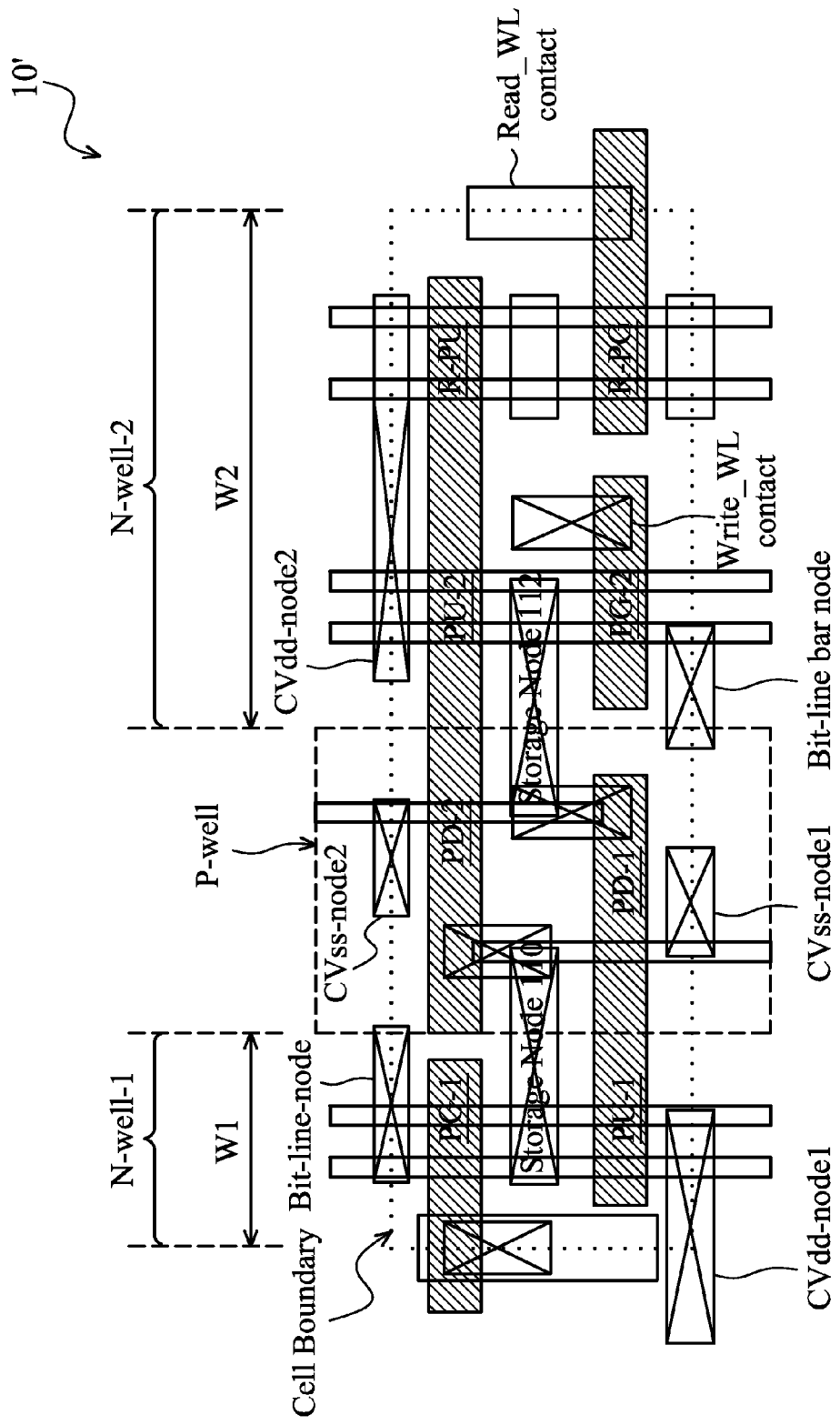
FIG. 10 illustrates a layout of the two-port SRAM cell in FIG. 9 in accordance with exemplary embodiments.

FIG. 10 illustrates an exemplary layout of the two-port SRAM cell 10', which includes a P-well region located between two N-well regions N-well-1 and N-well-2. P-type FinFETs R_PU and R_PG are disposed in N-well region N-well-2. Accordingly, width W2 of N-well region N-well-2 is greater than width W1 of N-well region N-well-1 in order to accommodate FinFETs R_PU and R_PG. It is realized that although transistors PG-1, PU-1, PG-2, PU-2, R_PU, and R_PG are illustrated as two-fin FinFETs, each of them may be a single-fin FinFET or may include more than two fins.

In accordance with the exemplary embodiments of the present disclosure, by adopting p-type pass-gate FinFETs, strong drive currents Ion can be obtained, and the speed of the respective SRAM cell is improved. The embodiments have good resistance to alpha-particle induced errors. The raised SiGe epitaxy regions for the source and drain regions of the FinFETs in the SRAM cells may result in a low contact resistance, and hence the drive currents Ion are further boosted. The landing margin for the contact plugs to land on the source and drain regions is also improved by using raised SiGe epitaxy regions.

In accordance with some embodiments, an SRAM cell includes a first pull-up FinFET and a second pull-up FinFET, and a first pull-down FinFET and a second pull-down FinFET forming cross-latched inverters with the first pull-up FinFET and the second pull-up FinFET. A first pass-gate FinFET is connected to drains of the first pull-up FinFET and the first pull-down FinFET. A second pass-gate FinFET is connected to drains of the second pull-up FinFET and the second pull-down FinFET, wherein the first and the second pass-gate FinFETs are p-type FinFETs. A p-well region is in a center region of the SRAM cell and underlying the first and the second pull-down FinFETs. A first and a second n-well region are on opposite sides of the p-well region.

In accordance with other embodiments, an SRAM cell includes a p-well region in the SRAM cell, a first n-well region and a second n-well region on opposite sides of the p-well region, a first semiconductor fin in the first n-well region, and a second semiconductor fin in the p-well region. A first gate electrode in the first n-well region. The first gate electrode crosses the first semiconductor fin to form a first pass-gate FinFET. A second gate electrode extends into the first n-well region and the p-well region. The second gate electrode forms a first pull-up FinFET with the first semiconductor fin, and a first pull-down FinFET with the second semiconductor fin.

In accordance with yet other embodiments, an SRAM cell includes a first pull-up FinFET and a second pull-up FinFET, and a first pull-down FinFET and a second pull-down FinFET forming cross-latched inverters with the first pull-up FinFET and the second pull-up FinFET. A first pass-gate FinFET is connected to first drains of the first pull-up FinFET and the first pull-down FinFET. A second pass-gate FinFET is connected to second drains of the second pull-up FinFET and the second pull-down FinFET, wherein the first and the second pass-gate FinFETs are p-type FinFETs. A third pull-up FinFET includes a gate connected to gates of the second pull-up FinFET and the second pull-down FinFET. A third pass-gate FinFET is cascaded with the third pull-up FinFET. A p-well region is underlying the first and the second pull-down FinFETs. A first and a second n-well region are on opposite sides of the p-well region. The first pull-up FinFET and the first pass-gate FinFET are in the first n-well region. The second and the third pull-up FinFETs and the second and the third pass-gate FinFETs are in the second n-well region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A Static Random Access Memory (SRAM) cell comprising:
   a first pull-up Fin Field-Effect Transistor (FinFET) and a second pull-up FinFET;
   a first pull-down FinFET and a second pull-down FinFET forming cross-latched inverters with the first pull-up FinFET and the second pull-up FinFET;
   a first pass-gate FinFET connected to drains of the first pull-up FinFET and the first pull-down FinFET;
   a second pass-gate FinFET connected to drains of the second pull-up FinFET and the second pull-down FinFET, wherein the first and the second pass-gate FinFETs are p-type FinFETs;
   a p-well region in a center region of the SRAM cell and underlying the first and the second pull-down FinFETs; and
   a first and a second n-well region on opposite sides of the p-well region.

2. The SRAM cell of claim 1 further comprising a long contact plug having a longitudinal direction parallel to a longitudinal direction of a semiconductor fin of the first pass-gate FinFET, wherein the long contact plug interconnects a drain region of the first pull-up FinFET and a drain region of the first pull-down FinFET.

3. The SRAM cell of claim 2 further comprising a butted contact plug connecting the long contact plug to a gate electrode of the second pull-down FinFET.

4. The SRAM cell of claim 1, wherein gate electrodes of the first pull-up FinFET and the first pass-down FinFET are interconnected to form a continuous gate electrode strip, and wherein the continuous gate electrode strip extends into the p-well region and the first n-well region.

5. The SRAM cell of claim 1, wherein the first pull-down FinFET is a single-fin FinFET, and wherein the first pull-up FinFET and the first pass-gate FinFET are multi-fin FinFETs.

6. The SRAM cell of claim 1, wherein the first pull-down FinFET, the first pull-up FinFET, and the first pass-gate FinFET are single-fin FinFETs.

7. The SRAM cell of claim 1, wherein source and drain regions of the first pull-up FinFET and the first pass-gate FinFET comprise epitaxy regions, and wherein the epitaxy regions comprise silicon germanium.

8. A Static Random Access Memory (SRAM) cell comprising:
   a p-well region in the SRAM cell;
   a first n-well region and a second n-well region on opposite sides of the p-well region;
   a first semiconductor fin in the first n-well region;
   a second semiconductor fin in the p-well region;
   a first gate electrode in the first n-well region, wherein the first gate electrode crosses the first semiconductor fin to form a first pass-gate Field-Effect Transistor (FinFET); and
   a second gate electrode extending into the first n-well region and the p-well region, wherein the second gate electrode forms a first pull-up FinFET with the first semiconductor fin, and a first pull-down FinFET with the second semiconductor fin.

9. The SRAM cell of claim 8 further comprising a long contact plug connecting the first semiconductor fin to the second semiconductor fin, wherein the long contact plug is between, and has a longitudinal direction parallel to, the first gate electrode and the second gate electrode.

10. The SRAM cell of claim 8 further comprising:
a third semiconductor fin in the first n-well region, wherein the third semiconductor fin forms a second pull-up FinFET with the second gate electrode; and
a third gate electrode in the first n-well region, wherein the third gate electrode forms a second pass-gate FinFET with the third semiconductor fin.

11. The SRAM cell of claim 8, wherein the second pull-up FinFET and the second pass-gate FinFET are single-fin FinFETs.

12. The SRAM cell of claim 8, wherein the first pull-up FinFET and the first pass-gate FinFET are multi-fin FinFETs.

13. The SRAM cell of claim 12, wherein the first pull-down FinFET is a single-fin FinFET.

14. The SRAM cell of claim 8, wherein source and drain regions of the first pull-up FinFET and the first pass-gate FinFET comprise epitaxy regions, and wherein the epitaxy regions comprise silicon germanium.

15. A Static Random Access Memory (SRAM) cell comprising:
a first pull-up Fin Field-Effect Transistor (FinFET) and a second pull-up FinFET;
a first pull-down FinFET and a second pull-down FinFET forming cross-latched inverters with the first pull-up FinFET and the second pull-up FinFET;
a first pass-gate FinFET connected to first drains of the first pull-up FinFET and the first pull-down FinFET;
a second pass-gate FinFET connected to second drains of the second pull-up FinFET and the second pull-down FinFET, wherein the first and the second pass-gate FinFETs are p-type FinFETs;
a third pull-up FinFET comprising a gate connected to gates of the second pull-up FinFET and the second pull-down FinFET;
a third pass-gate FinFET cascaded with the third pull-up FinFET;
a p-well region underlying the first and the second pull-down FinFETs; and
a first n-well region and a second n-well region on opposite sides of the p-well region, wherein the first pull-up FinFET and the first pass-gate FinFET are in the first n-well region, and wherein the second and the third pull-up FinFETs and the second and the third pass-gate FinFETs are in the second n-well region.

16. The SRAM cell of claim 15, wherein the first, the second, and the third pass-gate FinFETs and the first, the second, and the third pull-up FinFETs are p-type FinFETs.

17. The SRAM cell of claim 15, wherein the third pull-up FinFET and the third pass-gate FinFET forms a read port of the SRAM cell, and wherein a gate of the third pass-gate FinFET is connected to a read word-line.

18. The SRAM cell of claim 15, wherein the first pull-down FinFET is a single-fin FinFET, and wherein the first pull-up FinFET and the first pass-gate FinFET are multi-fin FinFETs.

19. The SRAM cell of claim 15, wherein the first pull-down FinFET, the first pull-up FinFET, and the first pass-gate FinFET are single-fin FinFETs.

20. The SRAM cell of claim 15, wherein source and drain regions of the first pull-up FinFET and the first pass-gate FinFET comprise epitaxy regions, and wherein the epitaxy regions comprise silicon germanium.

* * * * *